United States Patent
Lee et al.

(10) Patent No.: US 10,539,871 B2
(45) Date of Patent: *Jan. 21, 2020

(54) I-LINE NEGATIVE TYPE PHOTORESIST COMPOSITION HAVING EXCELLENT ETCHING RESISTANCE

(71) Applicant: YOUNG CHANG CHEMICAL CO., LTD, Gyeongsangbuk-do (KR)

(72) Inventors: Seung Hun Lee, Daegu (KR); Seung Hyun Lee, Daegu (KR); Sang Woong Yoon, Seoul (KR); Young Cheol Choi, Gumi-si (KR)

(73) Assignee: YOUNG CHANG CHEMICAL CO., LTD, Gyeongsangbuk-Do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 15/753,746

(22) PCT Filed: Aug. 26, 2016

(86) PCT No.: PCT/KR2016/009494
§ 371 (c)(1),
(2) Date: Feb. 20, 2018

(87) PCT Pub. No.: WO2017/039235
PCT Pub. Date: Mar. 9, 2017

(65) Prior Publication Data
US 2018/0246404 A1    Aug. 30, 2018

(30) Foreign Application Priority Data

Aug. 28, 2015 (KR) ................ 10-2015-0121408

(51) Int. Cl.
| | | |
|---|---|---|
| G03F 7/004 | (2006.01) | |
| G03F 7/038 | (2006.01) | |
| G03F 7/029 | (2006.01) | |
| G03F 7/027 | (2006.01) | |
| G03F 7/032 | (2006.01) | |
| G03F 7/16 | (2006.01) | |
| G03F 7/20 | (2006.01) | |
| G03F 7/32 | (2006.01) | |
| G03F 7/38 | (2006.01) | |

(52) U.S. Cl.
CPC ............ *G03F 7/0045* (2013.01); *G03F 7/027* (2013.01); *G03F 7/029* (2013.01); *G03F 7/032* (2013.01); *G03F 7/038* (2013.01); *G03F 7/162* (2013.01); *G03F 7/168* (2013.01); *G03F 7/2004* (2013.01); *G03F 7/322* (2013.01); *G03F 7/38* (2013.01)

(58) Field of Classification Search
USPC ........................................ 430/280.1, 270.1
See application file for complete search history.

(56) References Cited

U.S. PATENT DOCUMENTS

| | | | | |
|---|---|---|---|---|
| 3,855,093 | A * | 12/1974 | Guthrie ................. | C08G 63/52 427/518 |
| 5,130,467 | A * | 7/1992 | Mott ....................... | C07C 69/54 560/104 |
| 5,541,036 | A * | 7/1996 | Igawa ................... | G03F 7/0045 430/270.1 |
| 5,627,011 | A | 5/1997 | Minzel et al. | |
| 5,976,760 | A * | 11/1999 | Oomori ................. | G03F 7/0045 430/270.1 |
| 6,042,988 | A * | 3/2000 | Sato ...................... | G03F 7/0045 430/270.1 |
| 6,106,998 | A * | 8/2000 | Maeda ................... | G03F 7/038 430/280.1 |
| 6,451,948 | B1 * | 9/2002 | Woods ............... | C08F 222/1006 526/313 |
| 8,025,833 | B2 * | 9/2011 | Kodama ............... | B82Y 10/00 264/496 |
| 10,162,261 | B2 * | 12/2018 | Lee ........................ | G03F 7/004 |
| 2004/0018724 | A1 * | 1/2004 | Forman .................. | G03F 7/162 438/669 |
| 2016/0252655 | A1 * | 9/2016 | Hirayama .............. | G02B 1/045 385/131 |
| 2016/0362567 | A1 * | 12/2016 | Ono ......................... | G02B 3/00 |
| 2018/0203351 | A1 * | 7/2018 | Lee ......................... | G03F 7/004 |

FOREIGN PATENT DOCUMENTS

| | | | |
|---|---|---|---|
| JP | 2009256633 | A * | 11/2009 |
| KR | 10-2000-0058082 | A | 9/2000 |
| KR | 10-2001-0021256 | A | 3/2001 |
| KR | 10-2008-0053455 | A | 6/2008 |
| KR | 10-2008-0089785 | A | 10/2008 |
| KR | 10-2011-0022227 | A | 3/2011 |
| KR | 2013-0032071 | A | 4/2013 |

(Continued)

OTHER PUBLICATIONS

Azuma et al "Photo-polymerization and -copolymerization of Aromatic Diacrylates", Polymer Journal, vol. 4, No. 6, pp. 628-636 (1973). (Year: 1973).*

"Hydroquinone", CAS Registry No. 123-31-9 2 pages downloaded on Oct. 18, 2018 from SciFinder Database. (Year: 2018).*

English translation of JP 2009-256633 a, rom machine translation from AIPN Japan Patent Office National Center for Industrial Property Information and Training, generated Oct. 19, 2018, 12 pages/ (Year: 2018).*

Monroe et al , Chem. REv. 1992, vol. 93, pp. 435-448. (Year: 1992).*

CAS Registry No. 26397-5 obtained from SciFlnder database obtained Oct. 2018 (Year: 2018).*

(Continued)

*Primary Examiner* — Cynthia Hamilton
(74) *Attorney, Agent, or Firm* — Novick, Kim & Leem, PLLC; Jae Youn Kim

(57) ABSTRACT

This invention relates to an I-line negative photoresist composition having excellent etching resistance, which can exhibit superior etching resistance compared to conventional I-line negative photoresists and is thus suitable for use in semiconductor processing.

8 Claims, No Drawings

(56) References Cited

FOREIGN PATENT DOCUMENTS

WO    WO-2015080142 A1 *   6/2015   ............... G02B 3/00

OTHER PUBLICATIONS

Product catalog Electronics materials (Crosslinking agent for melamine resin), SANWA Chemical Co.,Ltd, UR>, http://sanwa-chemical.co.jp, 2 pages ,downloaded Jul. 21, 2019 by examiner. (Year: 2019).*

* cited by examiner

I-LINE NEGATIVE TYPE PHOTORESIST COMPOSITION HAVING EXCELLENT ETCHING RESISTANCE

TECHNICAL FIELD

The present invention relates to an I-line negative photoresist composition having high etching resistance.

BACKGROUND ART

With the recent demand to reduce the size and increase the degree of integration of semiconductor devices through the development of semiconductor-manufacturing technology, techniques for forming ultrafine patterns having line widths on the order of tens of nm or less are required. Advances in techniques for forming ultrafine patterns have been made through the use of light sources having smaller wavelengths as well as through the development of processing technology and photoresists suitable for such light sources.

A photoresist is used for photolithography for forming a variety of patterns. The term "photoresist" refers to a mixture of a polymer and a photosensitive agent, in which when the mixture, the chemical properties of which change due to light, is exposed to light at a predetermined wavelength, the solubility thereof in a specific solvent varies, and, due to a difference in dissolution rate between an exposed portion and an unexposed portion of the solvent, the portion that has not been dissolved is left behind after a predetermined dissolution time, thus forming a pattern.

The formation of a photoresist pattern includes negative tone development (NTD) using a negative tone developing solution and positive tone development (PTD) using a positive tone developing solution.

The process of forming a pattern through NTD includes selectively dissolving and removing an unexposed region using a negative tone developing solution, and the process of forming a pattern through PTD includes selectively dissolving and removing an exposed region using a positive tone developing solution.

When compared to pattern formation using PTD, pattern formation using NTD enables the formation of a reverse-phase pattern in a contact-hole pattern or a trench pattern, which is considered to be difficult to form due to insufficient exposure, thereby making it easy to consistently form a pattern. Furthermore, an organic solvent is used as the developing solution for removing the unexposed portion, thereby more effectively forming a photoresist pattern.

Meanwhile, a typical photolithography process using a photoresist composition includes coating a wafer with a photoresist, performing soft baking for heating the coated photoresist to evaporate the solvent, forming an image by means of a light source passed through a photomask, forming a pattern through a difference in solubility between an exposed portion and an unexposed portion using a developing solution, and completing a circuit through etching.

The photoresist composition is composed of a photosensitive agent (a photoacid generator) for generating an acid through excimer laser irradiation, a basic resin and other additives. The basic resin, configured such that a phenol structure contains a hydroxyl group, typically includes a polystyrene polymer, a cresol polymer, or a novolac polymer, but any photosensitive agent may be used so long as it is able to generate an acid ($H^+$) at a specific wavelength, and examples thereof may include sulfonium-, sulfonyl diazo-, benzo sulfonyl-, iodine-, chlorine-, and carboxylic acid-based organic and inorganic acids.

However, a negative photoresist obtained using the above composition is problematic in that the photosensitive agent therein is unable to generate a sufficient amount of acid ($H^+$), making it impossible to form a desired shape, and also in that a profile deteriorates upon the formation of a finer pattern.

Also, a light source mainly used for the above process has a wavelength range of 365 nm to 193 nm, examples of which include an I-line, a KrF excimer laser, and an ArF excimer laser. As is known in the art, the shorter the wavelength, the finer the pattern. In particular, conventional patents for I-line negative photoresist techniques are disclosed in Korean Patent Application Publication No. 2013-0032071 ⌈I-line photoresist composition and method of forming fine pattern using the same⌉, U.S. Pat. No. 5,627,011 ⌈High resolution i-line photoresist of high sensitivity⌉, etc.

DISCLOSURE

Technical Problem

Accordingly, the present invention is intended to provide an I-line negative photoresist composition having higher etching resistance than conventional I-line negative photoresists.

Technical Solution

Therefore, the present invention provides an I-line negative photoresist composition, comprising at least one selected from the group consisting of compounds represented by Chemical Formulas 1 to 5 below.

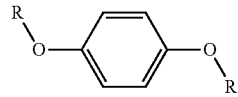

[Chemical Formula 1]

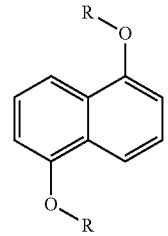

[Chemical Formula 2]

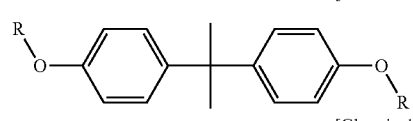

[Chemical Formula 3]

[Chemical Formula 4]

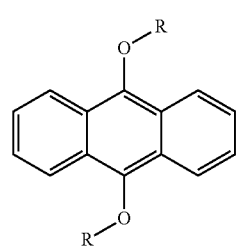

[Chemical Formula 5]

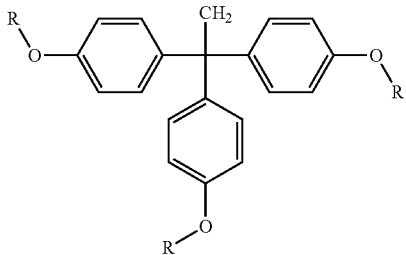

In Chemical Formulas 1 to 5, Rs are identical to or different from each other, and are independently any one selected from the group consisting of acryloyl, allyl, 3-ethoxyacryloyl, dimethylsilane allyl, methylacryl, trans-3-(benzoyl)acryl, 3-(2-furyl)acryl, 4-(benzyloxy)benzyl, and 1,4-bisacryloylpiperazine.

In a preferred embodiment of the present invention, the compounds represented by Chemical Formulas 1 to 5 are respectively obtained by subjecting 1,4-hydroquinone, naphthalene-1,5-diol, bisphenol A, anthracene-9,10-diol and 1,1,1-tris(4-hydroxyphenyl)ethane to a substitution reaction with a monomer.

In a preferred embodiment of the present invention, the compounds represented by Chemical Formulas 1 to 5 independently have a weight average molecular weight ranging from 100 to 20,000.

In a preferred embodiment of the present invention, the composition includes, based on the total weight of the composition, 5 to 50 wt % of a polymer resin, 0.1 to 10 wt % of at least one selected from the group consisting of compounds represented by Chemical Formulas 1 to 5, 1 to 10 wt % of a crosslinking agent, 0.1 to 10 wt % of a photoacid generator, 0.01 to 5 wt % of an acid diffusion inhibitor, and the remainder of a solvent.

In a preferred embodiment of the present invention, the polymer resin includes at least one selected from the group consisting of a phenol polymer resin and a cresol polymer resin, each of which contains a hydroxyl group.

In a preferred embodiment of the present invention, the phenol polymer resin includes 4-hydroxy-3-methyl benzoic acid, 4-hydroxy-2-methyl benzoic acid, 5-hydroxy-2-methyl benzoic acid, 3,5-di-tert-butyl-4-hydroxy benzoic acid, 4-hydroxy-3,5-dimethyl benzoic acid, 4-hydroxy isophthalic acid, 2,4,6-hydroxy toluene, 2,4,6-trihydroxy benzoic acid monohydrate, and 2,4,6-trihydroxy benzaldehyde, and the cresol polymer resin includes o-cresol, p-cresol, m-cresol, epoxy o-cresol, epoxy p-cresol, and epoxy m-cresol.

In a preferred embodiment of the present invention, the crosslinking agent includes at least one selected from the group consisting of tris(2,3-epoxypropyl)isocyanurate, trimethylolmethane triglycidyl ether, trimethylolpropane triglycidyl ether, hexamethylol melamine, trimethylolethane triglycidyl ether, hexamethoxymethyl melamine, hexamethoxyethyl melamine, tetramethylol 2,4-diamino-1,3,5-triazine, tetramethoxymethyl-2,4-diamino-1,3,5-triazine, tetramethylol glycoluril, tetramethoxymethyl glycoluril, tetramethoxyethyl glycoluril, tetramethylol urea, tetramethoxymethyl urea, tetramethoxyethyl urea, and tetramethoxyethyl-2,4-diamino-1,3,5-triazine.

In a preferred embodiment of the present invention, the photoacid generator includes at least one selected from the group consisting of tris(trichloromethyl)triazine, 1,1-bis(p-chlorophenyl)-2,2,2-trichloroethane, tris(methanesulfonyl)benzene, 1,1-bis(chlorophenyl)-2,2,2-trichloroethanol, 2,4,6-tris(tribromomethyl)-s-triazine, 2-methyl-4,6-bis(tribromomethyl)-s-triazine, 2-phenyl-4,6-bis(tribromomethyl)-s-triazine, 2-(4-methoxy-phenyl)-4,6-bis(trichloromethyl)-1,3,5-triazine, 2,4,6-tris(chloromethyl)-1,3,5-triazine, triphenylsulfonium triflate, and tribromophenyl sulfone.

In a preferred embodiment of the present invention, the acid diffusion inhibitor includes at least one selected from the group consisting of methyltriamine, ethyltriamine, dimethylamine, diethylamine, trimethylamine, triethylamine, tributylamine, methanol triamine, ethanol triamine, dimethanolamine, diethanolamine, trimethanolamine, triethanolamine and tributanolamine.

In Chemical Formulas 1 to 5 set forth above, Rs may be identical to or different from each other and are independently any one selected from the group consisting of acryloyl, allyl, 3-ethoxyacryloyl, dimethylsilane allyl, methylacryl, trans-3-(benzoyl)acryl, 3-(2-furyl)acryl, 4-(benzyloxy)benzyl, and 1,4-bisacryloylpiperazine.

In a preferred embodiment of the present invention, the compounds represented by Chemical Formulas 1 to 5 are respectively obtained by subjecting 1,4-hydroquinone, naphthalene-1,5-diol, bisphenol A, anthracene-9,10-diol and 1,1,1-tris(4-hydroxyphenyl)ethane to a substitution reaction with a monomer.

In a preferred embodiment of the present invention, the compounds represented by Chemical Formulas 1 to 5 independently have a weight average molecular weight ranging from 100 to 20,000.

In a preferred embodiment of the present invention, the composition includes, based on the total weight of the composition, 5 to 50 wt % of a polymer resin, 0.1 to 10 wt % of at least one selected from the group consisting of compounds represented by Chemical Formulas 1 to 5, 1 to 10 wt % of a crosslinking agent, 0.1 to 10 wt % of a photoacid generator, 0.01 to 5 wt % of an acid diffusion inhibitor, and the remainder of a solvent.

In a preferred embodiment of the present invention, the polymer resin includes at least one selected from the group consisting of a phenol polymer resin and a cresol polymer resin, each of which contains a hydroxyl group.

In a preferred embodiment of the present invention, the phenol polymer resin includes 4-hydroxy-3-methyl benzoic acid, 4-hydroxy-2-methyl benzoic acid, 5-hydroxy-2-methyl benzoic acid, 3,5-di-tert-butyl-4-hydroxy benzoic acid, 4-hydroxy-3,5-dimethyl benzoic acid, 4-hydroxy isophthalic acid, 2,4,6-hydroxy toluene, 2,4,6-trihydroxy benzoic acid monohydrate, and 2,4,6-trihydroxy benzaldehyde, and the cresol polymer resin is selected from among o-cresol, p-cresol, m-cresol, epoxy o-cresol, epoxy p-cresol, and epoxy m-cresol.

In a preferred embodiment of the present invention, the crosslinking agent includes at least one selected from the group consisting of tris(2,3-epoxypropyl)isocyanurate, trimethylolmethane triglycidyl ether, trimethylolpropane triglycidyl ether, hexamethylol melamine, trimethylolethane triglycidyl ether, hexamethoxymethyl melamine, hexamethoxyethyl melamine, tetramethylol 2,4-diamino-1,3,5-triazine, tetramethoxymethyl-2,4-diamino-1,3,5-triazine, tetramethylol glycoluril, tetramethoxymethyl glycoluril, tetramethoxyethyl glycoluril, tetramethylol urea, tetramethoxymethyl urea, tetramethoxyethyl urea, and tetramethoxyethyl-2,4-diamino-1,3,5-triazine.

In a preferred embodiment of the present invention, the photoacid generator includes at least one selected from the group consisting of tris(trichloromethyl)triazine, 1,1-bis(p-chlorophenyl)-2,2,2-trichloroethane, tris(methanesulfonyl)benzene, 1,1-bis(chlorophenyl)-2,2,2-trichloroethanol, 2,4,6-tris(tribromomethyl)-s-triazine, 2-methyl-4,6-bis(tribromomethyl)-s-triazine, 2-phenyl-4,6-bis(tribromomethyl)-s-triazine, 2-(4-methoxy-phenyl)-4,6-bis(trichloromethyl)-1,3,5-triazine, 2,4,6-tris(chloromethyl)-1,3,5-triazine, triphenylsulfonium triflate, and tribromophenyl sulfone.

In a preferred embodiment of the present invention, the acid diffusion inhibitor includes at least one selected from the group consisting of methyltriamine, ethyltriamine, dimethylamine, diethylamine, trimethylamine, triethylamine, tributylamine, methanol triamine, ethanol triamine, dimethanolamine, diethanolamine, trimethanolamine, triethanolamine, and tributanolamine.

Advantageous Effects

According to the present invention, the I-line negative photoresist composition can exhibit superior etching resistance compared to conventional I-line negative photoresists, and is thus suitable for use in semiconductor processing.

BEST MODE

Unless otherwise defined, all the technical and scientific terms used herein have the same meanings as those typically understood by those skilled in the art to which the present invention belongs. Generally, the nomenclature used herein is well known in the art and is typical.

As used herein, when any part is said to "include" any element, this does not mean that other elements are excluded, and such other elements may be further included unless otherwise specifically mentioned.

As used herein, the term "photoresist" refers to a mixture of a polymer and a photosensitive agent, in which when the mixture, the chemical properties of which change due to light, is exposed to light at a predetermined wavelength, the solubility thereof in a specific solvent varies, and, due to a difference in dissolution rate between an exposed portion and an unexposed portion of the solvent, the portion that has not been dissolved is left behind after a predetermined dissolution time, thus forming a pattern.

As used herein, the term "photolithography" means that, when a mask having a semiconductor circuit design is disposed between a light source and a photoresist film applied on a silicon wafer and then the light source is turned on, the circuit of the mask is transferred onto the photoresist using the properties of the photoresist as set forth above.

In the present invention, the term "I-line" refers to a light source having a wavelength range of 365 nm.

An embodiment of the present invention addresses an I-line negative photoresist composition, comprising at least one selected from the group consisting of compounds represented by Chemical Formulas 1 to 5 below.

[Chemical Formula 1]

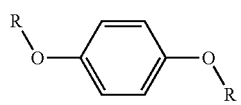

[Chemical Formula 2]

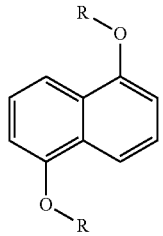

[Chemical Formula 3]

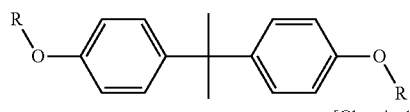

[Chemical Formula 4]

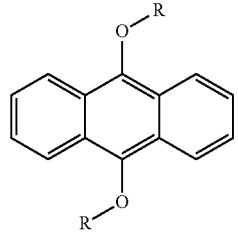

[Chemical Formula 5]

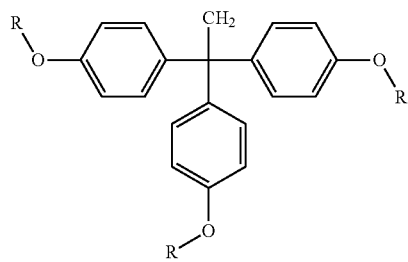

In Chemical Formulas 1 to 5, Rs are identical to or different from each other, and are independently any one selected from the group consisting of acryloyl, allyl, 3-ethoxyacryloyl, dimethylsilane allyl, methylacryl, trans-3-(benzoyl)acryl, 3-(2-furyl)acryl, 4-(benzyloxy)benzyl, and 1,4-bisacryloylpiperazine.

The compounds represented by Chemical Formulas 1 to 5 may be respectively obtained by subjecting 1,4-hydroquinone, naphthalene-1,5-diol, bisphenol A, anthracene-9,10-diol and 1,1,1-tris(4-hydroxyphenyl)ethane to a substitution reaction with a monomer.

Scheme 1 below illustrates the substitution reaction of a structure composed basically of 1,4-hydroquinone with a monomer.

<Scheme 1>

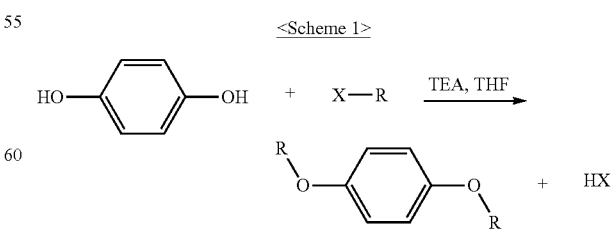

Scheme 2 below illustrates the substitution reaction of a structure composed basically of naphthalene-1,5-diol with a monomer.

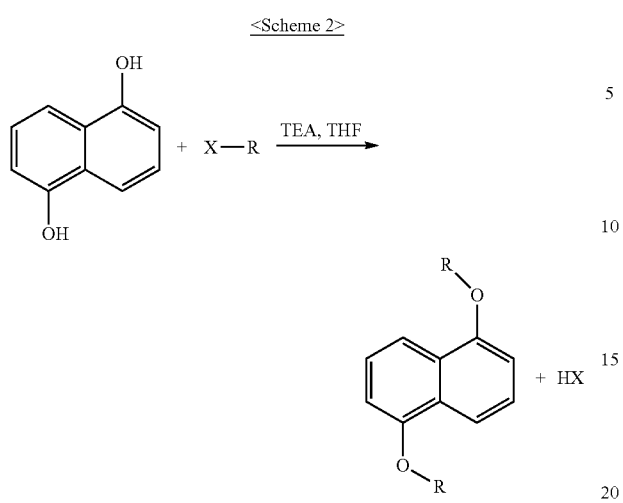

Scheme 3 below illustrates the substitution reaction of a structure composed basically of bisphenol A with a monomer.

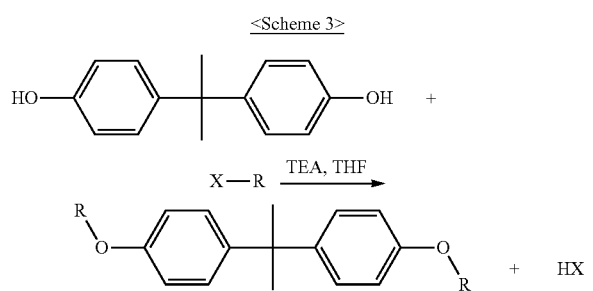

Scheme 4 below illustrates the substitution reaction of a structure composed basically of anthracene-9,10-diol with a monomer.

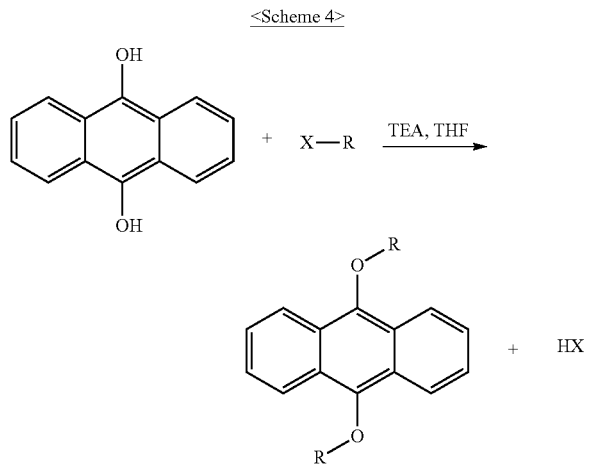

Scheme 5 below illustrates the substitution reaction of a structure composed basically of 1,1,1-tris(4-hydroxyphenyl) ethane with a monomer.

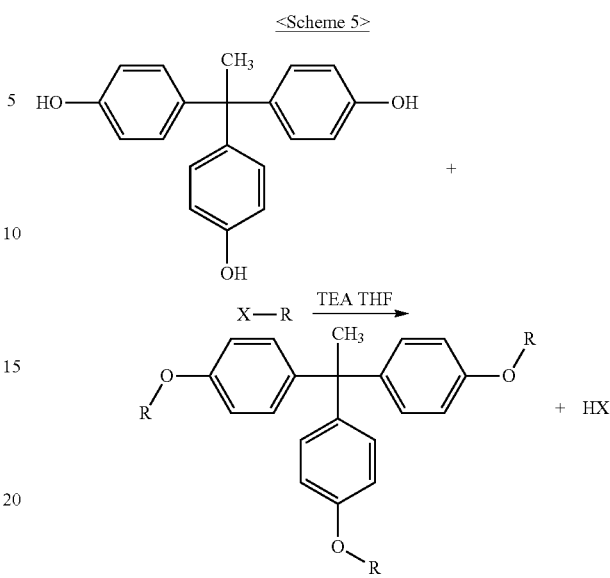

In Schemes 1 to 5, X—R represents a reactive monomer, X being at least one selected from the group consisting of Cl, $NH_2$, Br, OH and $OCH_3$, and R being at least one selected from the group consisting of acryloyl, allyl, 3-ethoxyacryloyl, dimethylsilane allyl, methylacryl, trans-3-(benzoyl) acryl, 3-(2-furyl)acryl, 4-(benzyloxy)benzyl and 1,4-bisacryloylpiperazine.

Specific examples of the reactive monomer may include acryloyl chloride, aryl chloride, acryloyl bromide, aryl chloride dimethylsilane, acrylic acid, bromoacetophenone, anthraquinone carbonyl chloride, aryl bromide dimethylsilane, chloroacetophenone, chloroanthracene, and bromoanthracene.

The compounds represented by Chemical Formulas 1 to 3, obtained through the above substitution reaction, may independently have a weight average molecular weight ranging from 100 to 20,000.

The I-line negative photoresist composition according to the present invention may include, based on the total weight of the composition, 5 to 50 wt % of a polymer resin, 0.1 to 10 wt % of at least one selected from the group consisting of compounds represented by Chemical Formulas 1 to 5, 1 to 10 wt % of a crosslinking agent, 0.1 to 10 wt % of a photoacid generator, 0.01 to wt % of an acid diffusion inhibitor, and the remainder of a solvent.

At least one selected from the group consisting of compounds represented by Chemical Formulas 1 to 5 is preferably contained in an amount of 0.1 to 10 wt % based on the total weight of the composition. If the amount of the compound is less than 0.1 wt %, there is no effect of increased etching resistance and it is difficult to confirm any improvement in performance such as a profile or the like. On the other hand, if the amount thereof exceeds 10 wt %, etching resistance may increase, but problems such as poor pattern and low resolution may occur.

The polymer resin may include at least one selected from the group consisting of a phenol polymer resin and a cresol polymer resin, each of which contains a hydroxyl group.

More specifically, the phenol polymer resin may include 4-hydroxy-3-methyl benzoic acid, 4-hydroxy-2-methyl benzoic acid, 5-hydroxy-2-methyl benzoic acid, 3,5-di-tert-butyl-4-hydroxy benzoic acid, 4-hydroxy-3,5-dimethyl benzoic acid, 4-hydroxy isophthalic acid, 2,4,6-hydroxy toluene, 2,4,6-trihydroxy benzoic acid monohydrate, and 2,4,6-trihydroxy benzaldehyde, and the cresol polymer resin may include o-cresol, p-cresol, m-cresol, epoxy o-cresol, epoxy p-cresol, and epoxy m-cresol.

The polymer resin is preferably contained in an amount of 5 to 50 wt % based on the total weight of the composition. If the amount of the polymer resin is less than 5 wt %, high exposure energy is required in order to perform patterning and development processes. On the other hand, if the amount thereof exceeds 50 wt %, it is difficult to form a uniform pattern, undesirably causing pattern residue.

The crosslinking agent may include at least one selected from the group consisting of tris(2,3-epoxypropyl)isocyanurate, trimethylolmethane triglycidyl ether, trimethylolpropane triglycidyl ether, hexamethylol melamine, trimethylolethane triglycidyl ether, hexamethoxymethyl melamine, hexamethoxyethyl melamine, tetramethylol 2,4-diamino-1,3,5-triazine, tetramethoxymethyl-2,4-diamino-1,3,5-triazine, tetramethylol glycoluril, tetramethoxymethyl glycoluril, tetramethoxyethyl glycoluril, tetramethylol urea, tetramethoxymethyl urea, tetramethoxyethyl urea, and tetramethoxyethyl-2,4-diamino-1,3,5-triazine.

The crosslinking agent is preferably contained in an amount of 1 to 10 wt % based on the total weight of the composition. If the amount of the crosslinking agent is less than 1 wt %, it is impossible to form a pattern due to the low ratio of remaining film. On the other hand, if the amount thereof exceeds 10 wt %, problems may occur due to a bridging phenomenon between patterns because of excessive crosslinking.

The photoacid generator may include at least one selected from the group consisting of tris(trichloromethyl)triazine, 1,1-bis(p-chlorophenyl)-2,2,2-trichloroethane, tris(methanesulfonyl)benzene, 1,1-bis(chlorophenyl)-2,2,2-trichloroethanol, 2,4,6-tris(tribromomethyl)-s-triazine, 2-methyl-4,6-bis(tribromomethyl)-s-triazine, 2-phenyl-4,6-bis(tribromomethyl)-s-triazine, 2-(4-methoxy-phenyl)-4,6-bis(trichloromethyl)-1,3,5-triazine, 2,4,6-tris(chloromethyl)-1,3,5-triazine, triphenylsulfonium triflate, and tribromophenyl sulfone.

The photoacid generator is preferably contained in an amount of 0.1 to 10 wt % based on the total weight of the composition. If the amount of the photoacid generator is less than 0.1 wt %, the formation of a pattern may become impossible due to the insufficient crosslinking density. On the other hand, if the amount thereof exceeds 10 wt %, poor patterning results (LWR, LER) may occur at pattern walls or edges owing to excessive acid generation.

The acid diffusion inhibitor may include at least one selected from the group consisting of methyltriamine, ethyltriamine, dimethylamine, diethylamine, trimethylamine, triethylamine, tributylamine, methanol triamine, ethanol triamine, dimethanolamine, diethanolamine, trimethanolamine, triethanolamine, and tributanolamine.

The acid diffusion inhibitor is preferably contained in an amount of 0.01 to 5 wt % based on the total weight of the composition. If the amount of the acid diffusion inhibitor is less than 0.01 wt %, poor patterning results (LWR, LER) may occur at pattern walls or edges owing to excessive acid generation. On the other hand, if the amount thereof exceeds 5 wt %, the formation of a pattern may become impossible.

Meanwhile, the I-line negative photoresist composition of the present invention may be used at 1,000 to 100,000 Å depending on the kind and amount of solvent that is used, and the I-line negative photoresist composition may be used after dissolution in an amount of 10 to 90 wt % based on the weight of the solvent.

The solvent may include ethyleneglycol monomethylether, ethyleneglycol monoethylether, methylcellosolve acetate, ethylcellosolve acetate, diethyleneglycol monomethylether, diethyleneglycol monoethylether, propyleneglycol methyl ether acetate, propyleneglycol propyl ether acetate, diethyleneglycol dimethylether, ethyl lactate, toluene, xylene, methylethylketone, cyclohexanone, 2-heptanone, 3-heptanone, and 4-heptanone, which may be used alone or in combination.

As described above, the I-line negative photoresist composition of the present invention contains at least one selected from the group consisting of compounds represented by Chemical Formulas 1 to 5, and is thus suitable for use in a semiconductor-manufacturing process, thereby realizing a profile in which etching resistance is superior even in the presence of an I-line (365 nm) exposure source.

MODE FOR INVENTION

Examples

A better understanding of the present invention may be obtained through the following examples, which are set forth to illustrate, but are not to be construed as limiting the scope of the present invention, as will be apparent to those skilled in the art.

Substitution Example 1

In a 500 ml 3-neck round-bottom flask with an argon reflux device, 22.0 g of 1,4-hydroquinone, 74.5 g of triethylamine, and 250 ml of anhydrous tetrahydrofuran were placed and stirred for 10 min using a magnetic bar. Stirring was performed for 10 min in an argon atmosphere, after which 36.2 g of acryloyl chloride was slowly added thereto for 10 min using a dropping funnel, and the resulting mixture was stirred at room temperature for 2 hr. After the completion of the reaction, the product was filtered and washed two times with water. The filtered product was completely dissolved in 150 ml of chloroform and purified five times using a 500 ml separatory funnel. Finally, the product dissolved in chloroform was further purified through column chromatography using a solvent mixture of methylene chloride and hexane mixed at a ratio of 1:1, thereby removing unreacted materials. Ultimately, a white solid compound of Chemical Formula 1 (R: acryloyl) having a weight average molecular weight of 163 was obtained, and no unreacted materials were detected through gel chromatography analysis.

Substitution Example 2

The procedure was carried out in the same manner as in Substitution Example 1, with the exception that 32.0 g of naphthalene-1,5-diol was used in lieu of 1,4-hydroquinone. Ultimately, a white solid compound of Chemical Formula 2 (R: acryloyl) having a weight average molecular weight of 213 was obtained, and no unreacted materials were detected through gel chromatography analysis.

Substitution Example 3

The procedure was carried out in the same manner as in Substitution Example 1, with the exception that 45.6 g of bisphenol A was used in lieu of 1,4-hydroquinone. Ultimately, a white solid compound of Chemical Formula 3 (R: acryloyl) having a weight average molecular weight of 281 was obtained, and no unreacted materials were detected through gel chromatography analysis.

Substitution Example 4

The procedure was carried out in the same manner as in Substitution Example 1, with the exception that 42.0 g of anthracene-9,10-diol was used in lieu of 1,4-hydroquinone. Ultimately, a white solid compound of Chemical Formula 4 (R: acryloyl) having a weight average molecular weight of 263 was obtained, and no unreacted materials were detected through gel chromatography analysis.

Substitution Example 5

The procedure was carried out in the same manner as in Substitution Example 1, with the exception that 61.2 g of 1,1,1-tris(4-hydroxyphenyl)ethane was used in lieu of 1,4-hydroquinone. Ultimately, a white solid compound of Chemical Formula 5 (R: acryloyl) having a weight average molecular weight of 359 was obtained, and no unreacted materials were detected through gel chromatography analysis.

Example 1

An I-line negative photoresist composition was prepared by mixing 100 g of a phenol polymer resin composed basically of 4-hydroxy-3-methyl benzoic acid having an average molecular weight of 5,000 as a basic resin, 4 g of the compound of Substitution Example 1, 10 g of tetramethoxymethyl glycoluril as a crosslinking agent, 4 g of 2-(4-methoxy-phenyl)-4,6-bis(trichloromethyl)-1,3,5-triazine as a photoacid generator, 0.6 g of tributylamine as an acid diffusion inhibitor, and a solvent mixture comprising 150 g of ethyl lactate and 700 g of propyleneglycol methyl ether acetate. The prepared composition was filtered using a syringe filter made of 0.1 μm Teflon, applied on a silicon wafer using a spin coater, soft-baked at 90° C. for 90 sec, and exposed to a light source at 365 nm. After the exposure process, a baking process at 110° C. for 90 sec and then a developing process using 2.38% tetramethyl ammonium hydroxide were performed, thus forming a pattern.

Example 2

The procedure was carried out in the same manner as in Example 1, with the exception that 4 g of the compound of Substitution Example 2 was used in lieu of the compound of Substitution Example 1.

Example 3

The procedure was carried out in the same manner as in Example 1, with the exception that 4 g of the compound of Substitution Example 3 was used in lieu of the compound of Substitution Example 1.

Example 4

The procedure was carried out in the same manner as in Example 1, with the exception that 4 g of the compound of Substitution Example 4 was used in lieu of the compound of Substitution Example 1.

Example 5

The procedure was carried out in the same manner as in Example 1, with the exception that 4 g of the compound of Substitution Example 5 was used in lieu of the compound of Substitution Example 1.

Example 6

The procedure was carried out in the same manner as in Example 1, with the exception that 10 g of the compound of Substitution Example 2 was used in lieu of the compound of Substitution Example 1.

Example 7

The procedure was carried out in the same manner as in Example 1, with the exception that 10 g of the compound of Substitution Example 4 was used in lieu of the compound of Substitution Example 1.

Example 8

The procedure was carried out in the same manner as in Example 1, with the exception that 120 g of the compound of Substitution Example 5 was used in lieu of the compound of Substitution Example 1.

Comparative Example 1

The procedure was carried out in the same manner as in Example 1, with the exception that the compound of Substitution Example 1 was not added.

Measurement of Properties

The properties of the I-line negative photoresist compositions of Examples 1 to 8 and Comparative Example 1 were measured.

The resolution was determined by observing the minimum line width (resolution) based on L/S (Line, Space) using a critical-dimension scanning electron microscope (CD-SEM) able to observe the critical dimensions of a pattern on the wafers obtained in Examples 1 to 8 and Comparative Example 1.

The etching resistance was evaluated on the wafers obtained in Examples 1 to 8 and Comparative Example 1 using an inductively coupled plasma reactive ion etching (ICP-RIE) device. Here, the measured value of etching resistance of Comparative Example 1 was standardized to 1, and the measured values of etching resistance of Examples were compared thereto and evaluated.

The measurement results are shown in Table 1 below.

TABLE 1

| No. | | Etching resistance | Resolution (μm) |
| --- | --- | --- | --- |
| Example | 1 | 0.98 | 0.5 |
| | 2 | 0.95 | 0.4 |
| | 3 | 0.96 | 0.4 |
| | 4 | 0.94 | 0.35 |
| | 5 | 0.97 | 0.4 |
| | 6 | 0.90 | 0.35 |
| | 7 | 0.91 | 0.4 |
| | 8 | 0.78 | 0.8 |
| Comparative Example | 1 | 1.00 | 0.5 |

As is apparent from Table 1, Examples 1 to 7 were superior in etching resistance compared to the conventionally known composition as in Comparative Example 1, and the resolution was similar or improved depending on the compound that was selected. However, in Example 8, in which the compound of Substitution Example 5 was added in excess, etching resistance was superior but the resolution was deteriorated.

In conclusion, when at least one selected from the group consisting of compounds represented by Chemical Formulas 1 to 5 is contained in an optimal amount, an I-line negative photoresist composition having superior etching resistance can be found to result.

All simple modifications or variations of the present invention may be easily performed by those skilled in the art, and may be incorporated in the scope of the present invention.

The invention claimed is:

1. An I-line negative photoresist composition, comprising, based on a total weight of the composition:
   5 to 50 wt % of a polymer resin;
   0.1 to 10 wt % of at least one selected from the group consisting of compounds represented by Chemical Formulas 1 to 5 below:

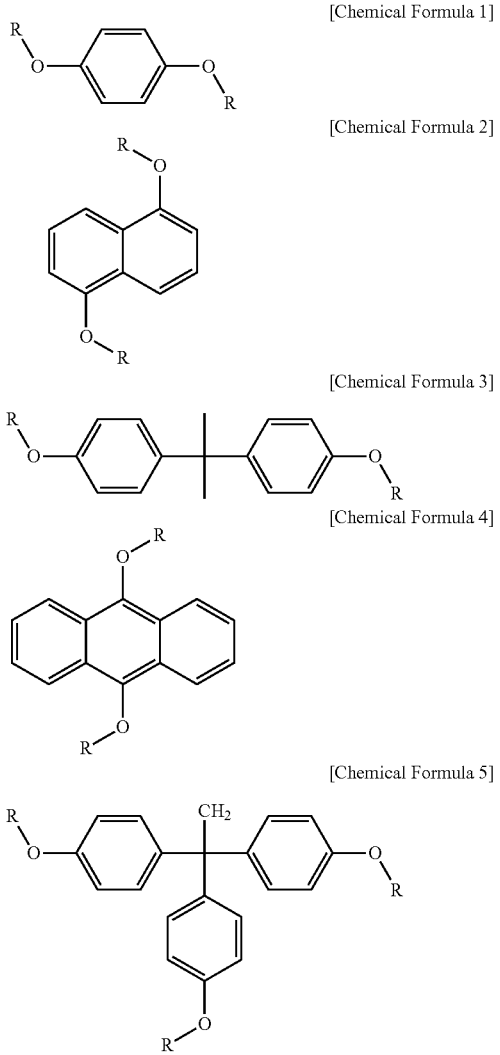

in Chemical Formulas 1 to 5, Rs are identical to or different from each other, and are independently any one selected from the group consisting of acryloyl, allyl, 3-ethoxyacryloyl, methylacryl, trans-3-(benzoyl) acryl, and 3-(2-furyl)acryl;
   1 to 10 wt % of a crosslinking agent;
   0.1 to 10 wt % of a photoacid generator;
   0.01 to 5 wt % of an acid diffusion inhibitor; and
   a remainder of a solvent.

2. The Mine negative photoresist composition of claim 1, wherein the compounds represented by Chemical Formulas 1 to 5 are respectively obtained by subjecting 1,4-hydroquinone, naphthalene-1,5-diol, bisphenol A, anthracene-9,10-diol and 1,1,1-tris(4-hydroxyphenyl)ethane to a substitution reaction with acryloyl chloride.

3. The Mine negative photoresist composition of claim 1, wherein the compounds represented by Chemical Formulas 1 to 5 independently have a weight average molecular weight ranging from 163 to 500.

4. The Mine negative photoresist composition of claim 1, wherein the polymer resin includes at least one selected from the group consisting of a phenol polymer resin and a cresol polymer resin, each of which contains a hydroxyl group.

5. The Mine negative photoresist composition of claim 4, wherein the phenol polymer resin is obtained from at least one monomer selected from the group consisting of 4-hydroxy-3-methyl benzoic acid, 4-hydroxy-2-methyl benzoic acid, 5-hydroxy-2-methyl benzoic acid, 3,5-di-tert-butyl-4-hydroxy benzoic acid, 4-hydroxy-3,5-dimethyl benzoic acid, 4-hydroxy isophthalic acid, 2,4,6-hydroxy toluene, 2,4,6-trihydroxy benzoic acid monohydrate, and 2,4,6-trihydroxy benzaldehyde, and the cresol polymer resin is obtained from at least one monomer selected from the group consisting of o-cresol, p-cresol, m-cresol, epoxy o-cresol, epoxy p-cresol, and epoxy m-cresol.

6. The Mine negative photoresist composition of claim 1, wherein the crosslinking agent includes at least one selected from the group consisting of tris(2,3-epoxypropyl)isocyanurate, trimethylolmethane triglycidyl ether, trimethylolpropane triglycidyl ether, hexamethylol melamine, trimethylolethane triglycidyl ether, hexamethoxymethyl melamine, hexamethoxyethyl melamine, tetramethylol 2,4-diamino-1,3,5-triazine, tetramethoxymethyl-2,4-diamino-1,3,5-triazine, tetramethylol glycoluril, tetramethoxymethyl glycoluril, tetramethoxyethyl glycoluril, tetramethylol urea, tetramethoxymethyl urea, tetramethoxyethyl urea, and tetramethoxyethyl-2,4-diamino-1,3,5-triazine.

7. The Mine negative photoresist composition of claim 1, wherein the photoacid generator includes at least one selected from the group consisting of tris(trichloromethyl) triazine, 1,1-bis(p-chlorophenyl)-2,2,2-trichloroethane, tris (methanesulfonyl)benzene, 1,1-bis(chlorophenyl)-2,2,2-trichloroethanol, 2,4,6-tris(tribromomethyl)-s-triazine, 2-methyl-4,6-bis(tribromomethyl)-s-triazine, 2-phenyl-4,6-bis(tribromomethyl)-s-triazine, 2-(4-methoxy-phenyl)-4,6-bis(trichloromethyl)-1,3,5-triazine, 2,4,6-tris(chloromethyl)-1,3,5-triazine, triphenylsulfonium triflate, and tribromophenyl sulfone.

8. The Mine negative photoresist composition of claim 1, wherein the acid diffusion inhibitor includes at least one selected from the group consisting of methyltriamine, ethyltriamine, dimethylamine, diethylamine, trimethylamine, triethylamine, tributylamine, methanol triamine, ethanol triamine, dimethanolamine, diethanolamine, trimethanolamine, triethanolamine, and tributanolamine.

* * * * *